(12) United States Patent
Aiba et al.

(10) Patent No.: US 11,081,244 B2
(45) Date of Patent: Aug. 3, 2021

(54) INCORE NUCLEAR INSTRUMENTATION SYSTEM

(71) Applicant: MITSUBISHI ELECTRIC CORPORATION, Tokyo (JP)

(72) Inventors: Toshihide Aiba, Tokyo (JP); Atsushi Saito, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 641 days.

(21) Appl. No.: 15/736,040

(22) PCT Filed: Sep. 8, 2015

(86) PCT No.: PCT/JP2015/075402
§ 371 (c)(1),
(2) Date: Dec. 13, 2017

(87) PCT Pub. No.: WO2017/042876
PCT Pub. Date: Mar. 16, 2017

(65) Prior Publication Data
US 2018/0122520 A1    May 3, 2018

(51) Int. Cl.
*G21C 17/108* (2006.01)
*G01T 3/00* (2006.01)
(Continued)

(52) U.S. Cl.
CPC ............. *G21C 17/108* (2013.01); *G01T 1/17* (2013.01); *G01T 3/00* (2013.01); *G21C 17/10* (2013.01);
(Continued)

(58) Field of Classification Search
CPC ........ G21C 17/108; G21D 3/001; G01T 1/17; G01T 3/00; H04B 1/01; H04B 2001/0416;
(Continued)

(56) References Cited

U.S. PATENT DOCUMENTS 4,053,355 A * 10/1977 Vuckovich ........... G01D 5/2515
376/258
4,655,994 A * 4/1987 Greenberg ........... G21C 17/108
376/254
(Continued)

FOREIGN PATENT DOCUMENTS

JP        S 62-56898 A     3/1987
JP        H 06-194452 A    7/1994
(Continued)

OTHER PUBLICATIONS

International Search Report (PCT/ISA/210) dated Nov. 2, 2015, by the Japan Patent Office as the International Searching Authority for International Application No. PCT/JP2015/075402.
(Continued)

*Primary Examiner* — Lily C Garner
(74) *Attorney, Agent, or Firm* — Buchanan Ingersoll & Rooney PC (57) ABSTRACT

In an encore nuclear instrumentation system which is equipped with a movable type neutron detector, an object of the invention is to control measurement errors due to the degradation of the system. The incore nuclear instrumentation system includes a neutron detector which is to be installed in a nuclear reactor stored in a containment vessel, and an instrumentation unit which has a current detector circuit and is to be installed on the outside of the containment vessel. An output signal of the neutron detector is inputted into the current detector circuit, and the instrumentation unit remembers a matrix which shows a relation among a reactor power of the nuclear reactor, a gain of the current detector circuit, and an output voltage Vn of the current detector circuit, and the calibration of the current detector circuit is performed with reference to the matrix.

10 Claims, 7 Drawing Sheets

| ... | Reactor Power 10% Level | | ... | Reactor Power 50% Level | | ... | Reactor Power 70% Level | | ... |
|---|---|---|---|---|---|---|---|---|---|
| ... | GAIN | Vn | ... | GAIN | Vn | ... | GAIN | Vn | ... |
| ... | β 11 | α 11 | ... | β 51 | α 51 | ... | β 71 | α 71 | ... |
| ... | β 12 | α 12 | ... | β 52 | α 52 | ... | β 72 | α 72 | ... |
| ... | β 13 | α 13 | ... | β 53 | α 53 | ... | β 73 | α 73 | ... |
| ... | β 14 | α 14 | ... | β 54 | α 54 | ... | β 74 | α 74 | ... |
| ... | ... | ... | ... | ... | ... | ... | ... | ... | ... |
| ... | ... | ... | ... | ... | ... | ... | ... | ... | ... |
| ... | ... | ... | ... | ... | ... | ... | ... | ... | ... |
| ... | ... | ... | ... | ... | ... | ... | ... | ... | ... |

(51) Int. Cl.
*G21C 17/10* (2006.01)
*H03G 1/00* (2006.01)
*G21D 3/00* (2006.01)
*H04B 14/04* (2006.01)
*H03G 3/00* (2006.01)
*H04B 1/04* (2006.01)
*G01T 1/17* (2006.01)

(52) U.S. Cl.
CPC .............. *G21D 3/001* (2013.01); *H03G 1/00* (2013.01); *H03G 1/0005* (2013.01); *H03G 3/00* (2013.01); *H04B 1/04* (2013.01); *H04B 14/042* (2013.01); *H04B 2001/0416* (2013.01)

(58) Field of Classification Search
CPC ........ H04B 14/042; G01R 31/28; H03G 1/00; H03G 1/0005; H03G 3/00
See application file for complete search history.

(56) References Cited

U.S. PATENT DOCUMENTS

| | | | | |
|---|---|---|---|---|
| 4,794,343 A * | 12/1988 | Yang | .......... | H03G 3/00 330/2 |
| 7,777,546 B2 * | 8/2010 | Liu | .......... | H03F 3/45183 327/307 |
| 8,711,136 B2 * | 4/2014 | Park | .......... | G09G 3/006 345/211 |
| 8,724,349 B2 * | 5/2014 | Tang | .......... | H02M 3/33515 363/21.18 |
| 9,116,245 B2 * | 8/2015 | Moteki | .......... | G01T 1/02 |
| 9,157,963 B2 * | 10/2015 | Li | .......... | G01R 31/3835 |
| 9,269,302 B2 * | 2/2016 | Gu | .......... | G09G 3/3258 |
| 9,601,043 B2 * | 3/2017 | Hikichi | .......... | G09G 3/3688 |
| 10,650,932 B2 * | 5/2020 | Aiba | .......... | G21D 3/10 |
| 2007/0063839 A1 | 3/2007 | Oda et al. | | |
| 2010/0283773 A1 * | 11/2010 | Kim | .......... | G09G 3/20 345/211 |
| 2011/0031907 A1 * | 2/2011 | Takahashi | .......... | H02P 21/141 318/139 |
| 2012/0201339 A1 * | 8/2012 | Nakamura | .......... | G21C 17/108 376/254 |
| 2013/0142298 A1 * | 6/2013 | Nakanosono | .......... | G21C 17/108 376/259 |
| 2013/0243146 A1 * | 9/2013 | Nagae | .......... | G21D 3/001 376/254 |
| 2017/0047132 A1 * | 2/2017 | Tsuda | .......... | G01N 23/005 |
| 2017/0115340 A1 * | 4/2017 | Sung | .......... | G05F 3/02 |

FOREIGN PATENT DOCUMENTS

| | | | | |
|---|---|---|---|---|
| JP | H 07-294688 A | | 11/1995 | |
| JP | H 10-26668 A | | 1/1998 | |
| JP | 2000-009877 A | | 1/2000 | |
| JP | 2000-266884 A | | 9/2000 | |
| JP | 2000266884 A | * | 9/2000 | |
| JP | 2002-116283 A | | 4/2002 | |
| JP | 2003-177194 A | | 6/2003 | |
| JP | 2006084345 A | * | 3/2006 | |
| JP | 2007-040718 A | | 2/2007 | |
| JP | 2007132936 A | * | 5/2007 | .............. H03G 1/00 |
| JP | 2007-163366 A | | 6/2007 | |
| JP | 2007-225296 A | | 9/2007 | |
| JP | 4048194 B2 | * | 2/2008 | .......... G11C 29/028 |
| JP | 2012163362 A | * | 8/2012 | .......... G21C 17/108 |
| JP | 2013-120057 A | | 6/2013 | |

OTHER PUBLICATIONS

Written Opinion (PCT/ISA/237) dated Nov. 2, 2015, by the Japan Patent Office as the International Searching Authority for International Application No. PCT/JP2015/075402.

* cited by examiner

| | Reactor Power 10% Level | | ... | Reactor Power 50% Level | | ... | Reactor Power 70% Level | | ... |
|---|---|---|---|---|---|---|---|---|---|
| ... | GAIN | Vn | ... | GAIN | Vn | ... | GAIN | Vn | ... |
| ... | β11 | α11 | ... | β51 | α51 | ... | β71 | α71 | ... |
| ... | β12 | α12 | ... | β52 | α52 | ... | β72 | α72 | ... |
| ... | β13 | α13 | ... | β53 | α53 | ... | β73 | α73 | ... |
| ... | β14 | α14 | ... | β54 | α54 | ... | β74 | α74 | ... |
| ... | ... | ... | ... | ... | ... | ... | ... | ... | ... |
| ... | ... | ... | ... | ... | ... | ... | ... | ... | ... |
| ... | ... | ... | ... | ... | ... | ... | ... | ... | ... |
| ... | ... | ... | ... | ... | ... | ... | ... | ... | ... |

INCORE NUCLEAR INSTRUMENTATION SYSTEM

FIELD OF THE INVENTION

The present invention relates to instrumentation systems. More particularly, the present invention relates to an incore nuclear instrumentation system which can be applied to a nuclear reactor.

BACKGROUND OF THE INVENTION

At a nuclear power generation plant, measuring the neutron of a reactor core has been performed, in order to monitor the output of a nuclear reactor (refer to Patent Documents 1-7, for example). An incore nuclear instrumentation system is equipped with a movable type neutron detector, and is applied to a pressurized water reactor or a boiling water reactor. Tens of thimbles are inserted into the nuclear reactor, and they secure the passages of a neutron detector. In order to measure the output distribution of a reactor core, a movable type neutron detector is introduced by remote control into thimbles installed in the core.

In a pressurized water reactor, the output distribution of a reactor core is obtained by measuring the neutron flux in a nuclear reactor. A movable type neutron detector is inserted into thimbles installed in the reactor vessel, and detects the neutron flux. The incore nuclear instrumentation system controls the movable type neutron detector remotely, and drives the neutron detector to run inside of the thimble. A miniature fission chamber type neutron detector is applied to the neutron detector. When a neutron enters the fission chamber type detector, ionization current will be produced and the produced ionization current will be taken out to the outside of a nuclear reactor with a signal processing card.

CITATION LIST

Patent Literature

Patent Document 1 JP 2013-120057 A
Patent Document 2 JP 2003-177194 A
Patent Document 3 JP 2007-225296 A
Patent Document 4 JP 2002-116283 A
Patent Document 5 JP 2007-163366 A
Patent Document 6 JP H6-194452 A
Patent Document 7 JP H7-294688 A

SUMMARY OF THE INVENTION

Technical Problem

A movable type incore nuclear instrumentation system measures the distribution of neutron fluxes along the direction of an axis which extends from the upper end to the lower end of the fuel assembly in a nuclear reactor. The incore nuclear instrumentation system employs a plurality of movable type neutron detectors, and then, measured data include variations which result from the individual difference of the used detectors. In order to obtain more accurate data, it is necessary to correct the difference in sensitivity which is inherent in each detector. For example, measurements at the same point have been carried out using all of the neutron detectors sequentially, and analysis of the data is separately conducted with a device for exclusive use (refer to Patent Document 1).

In other words, efforts have been made to bring the distribution of neutron fluxes closer to true values, by employing a device for exclusive use and correcting the sensitivity difference in each detector. The method mentioned above requires additional work for processing measurement data, since the correction is performed using a different dedicated device. In addition, the measurement data are not constantly monitored, and then, the method cannot grasp the degradation signs of a neutron detector. Works for specify a cause will be started after an abnormal value is detected in the measurement data. Accordingly, the approach for grasping the degradation may be one step behind.

The present invention is made in accordance with the above discussion. In an incore nuclear instrumentation system which is equipped with a movable type neutron detector, an objective of the present invention is to reduce errors in the measurement by the degradation of a measurement system, and a further objective is to enable the system to maintain the soundness.

Solution to Problem

An incore nuclear instrumentation system according to the present invention includes a neutron detector which is to be installed in a nuclear reactor stored in a containment vessel, and an instrumentation unit which has a current detector circuit and is to be installed on the outside of the containment vessel, wherein an output signal of the neutron detector is inputted into the current detector circuit, and the instrumentation unit remembers a matrix which shows a relation among a reactor power of the nuclear reactor, a gain of the current detector circuit, and an output voltage Vn of the current detector circuit, and the calibration of the current detector circuit is performed with reference to the matrix.

Advantageous Effects of Invention

According to the incore nuclear instrumentation system of the present invention, neutron detectors are allowed to calibrate the detection sensitivity, and then, variations in the measured data due to the individual difference of the detectors can be reduced. Moreover, accuracy in measured values is improved by the reduction in the variations of the measured data. Furthermore, since the incore nuclear instrumentation system according to the present invention self performs the correction procedure, correction works with a different dedicated device can be eliminated.

DESCRIPTION OF EMBODIMENTS

Hereinafter, an incore nuclear instrumentation system according to the embodiments of the present invention will be described with reference to drawings. Incidentally, the same reference numerals are given to those identical or similar to constitutional portions in respective drawings and the size and/or the scale size of the corresponding respective constitutional portions are respectively independent. For example, when the identical constitutional portions, which are not changed, are shown, the size and/or the scale size of the identical constitutional portions may different among sectional views in which a part of the configuration is changed. Furthermore, although the configurations of the incore nuclear instrumentation system are further actually provided with a plurality of members, for ease of explanation, only portions necessary for explanation will be described and other portions are omitted.

Embodiment 1

The incore nuclear instrumentation system in accordance with the embodiments of the present invention keeps in remembrance a matrix which shows the relation among reactor powers of a nuclear reactor, gains of a current detector circuit, and output voltages of a current detector circuit. A software (S/W) of the incore nuclear instrumentation system carries out correction operations automatically based on a correction function (processing flow) between the gain and the output voltage. In order to carry out the sensitivity correction of the individual difference among neutron detectors, measurement data detected at a specific measurement point which is common to all of the detectors are compared with the matrix of the gain and the output voltage which has been acquired in advance. Hereinafter, the operation and function of the incore nuclear instrumentation system in accordance with the present embodiments will be described based on drawings.

Figure 1:
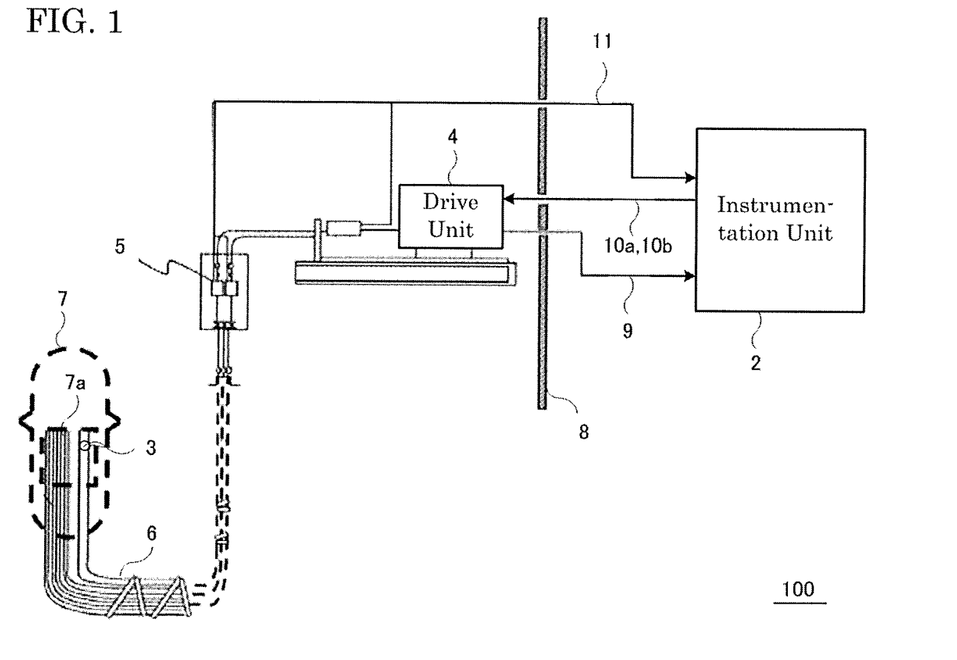
FIG. 1 is an overall view for showing the components of an incore nuclear instrumentation system in accordance with embodiments of the present invention.

First of all, an overall configuration of an incore nuclear instrumentation system in accordance with embodiments of the present invention is described with reference to the drawings. FIG. 1 shows an outline of the incore nuclear instrumentation system 100 which is applied to a pressurized water reactor and others. In the pressurized water reactor, the distribution of outputs at a reactor core can be monitored by measuring the neutron flux in a reactor. The incore nuclear instrumentation system 100 consists of an instrumentation unit 2, a neutron detector 3, a drive unit 4, a passage selection unit 5, thimbles 6, and others. In the drawing, a nuclear reactor 7 and a containment vessel 8 are shown as main structure members relevant to the incore nuclear instrumentation system 100. The nuclear reactor 7 is stored in the containment vessel 8, and is equipped with a reactor core 7a, which is an object to be measured. The neutron detector 3 is installed in the nuclear reactor 7 which is stored in the reactor vessel. Primary main instruments, such as a pressurization machine and a primary system coolant pump and others, are installed in the containment vessel 8 which stores the nuclear reactor 7 and the reactor core 7a. In the reactor core 7a, tens of thimbles 6 are inserted.

Neutron fluxes at the reactor core 7a of the nuclear reactor 7 are detected with a movable type neutron detector 3. The distribution of neutron fluxes at the reactor core 7a is measured by remotely controlling the neutron detector 3 to run inside of thimbles which are installed in the reactor. An output signal (neutron flux signal) from the neutron detector 3 is inputted into the instrumentation unit 2, which is installed on the outside of the containment vessel 8. The instrumentation unit 2 carries out the detection and monitoring of output signals, the storing of the data, and others. Tens of thimbles 6 are inserted into the reactor and become passages of the neutron detector 3 which is to be inserted into the reactor core 7a of the nuclear reactor 7. The neutron detector 3, the drive unit 4, the passage selection unit 5, and thimbles 6 are placed inside of the containment vessel 8. Remote controlling from the instrumentation unit 2 is employed for the operation of the neutron detector 3 (insertion and withdrawal).

The drive unit 4 performs an insertion of the neutron detector 3 to a thimble 6, or a withdrawal of the neutron detector 3 from the thimble 6, in response to the directions or commands from the instrumentation unit 2. The passage selection unit 5 selects a thimble 6 where the neutron detector 3 runs. Here, although the instrumentation unit 2 is installed outside of the containment vessel 8, other units like the drive unit 4, except the instrumentation unit, are installed in the inside of the containment vessel 8. A fission chamber of movable type is generally employed as the neutron detector 3. When neutron enters the fission chamber, ionization current will be generated. In order to ionize a filler gas with an incident neutron, a direct current high voltage is applied to the neutron detector 3. The direct current high voltage which is applied to the neutron detector 3 is set at a value (voltage) which shows a plateau characteristic, lest the relation between an detector current and a neutron flux density should suffer from fluctuations due to the applied high voltage.

Next, descriptions will be made, as to an insertion operation of the neutron detector 3 into a nuclear reactor and a withdrawal operation out of the nuclear reactor, including the transmission and receipt of signals between the instrumentation unit 2 and the neutron detector 3, or the drive unit 4, or the passage selection unit 5. When an insertion operation command 10a of the neutron detector 3 is issued to the drive unit 4 and the passage selection unit 5 from the instrumentation unit 2 which performs the controlling and monitoring of the incore nuclear instrumentation system 100, the passage selection unit 5 which is installed in the inside of the containment vessel 8 switch the passage of the neutron detector 3. The drive unit 4 which is installed in the inside of the containment vessel 8 performs an insertion operation of the movable type neutron detector 3 to another thimble located at the nuclear reactor 7.

A passage selection signal 11 for showing the passage (thimble) which is now chosen to the neutron detector is outputted, from the passage selection unit 5 to the instrumentation unit 2. An output signal (neutron flux signal 9) from the neutron detector 3 which is inserted at the core of the nuclear reactor 7 is inputted into the instrumentation unit 2. Signal processing to the output signal of the neutron detector 3 is performed in the instrumentation unit 2, and the distribution of neutron fluxes of the reactor core 7a is measured. When the neutron detector 3 detects the distribution of neutron fluxes in the core of the nuclear reactor 7 and is inserted into the tip part of a thimble 6 in the reactor core, a withdrawal operation command 10b will be issued to the drive unit 4 from the instrumentation unit 2. The drive unit 4 pulls out the neutron detector 3 from the nuclear reactor 7 to the passage selection unit 5, according to the withdrawal operation command 10b.

At the next step, when an insertion operation command 10a to select another thimble 6 is issued from the instrumentation unit 2 to the drive unit 4 and the passage selection unit 5, the passage selection unit 5 which is installed in the inside of the containment vessel 8 changes passages (thimbles) and the drive unit 4 performs the insertion operation of the movable type neutron detector 3 to another thimble 6 disposed in the inside of the nuclear reactor 7. It is to be noted that, the incore nuclear instrumentation system 100 in an actual case is provided with a plurality of neutron detectors 3. The drive unit 4 and the passage selection unit 5 can drive three to four neutron detectors 3 at the same time to run in thimbles 6 which are installed in the nuclear reactor.

Figure 2:
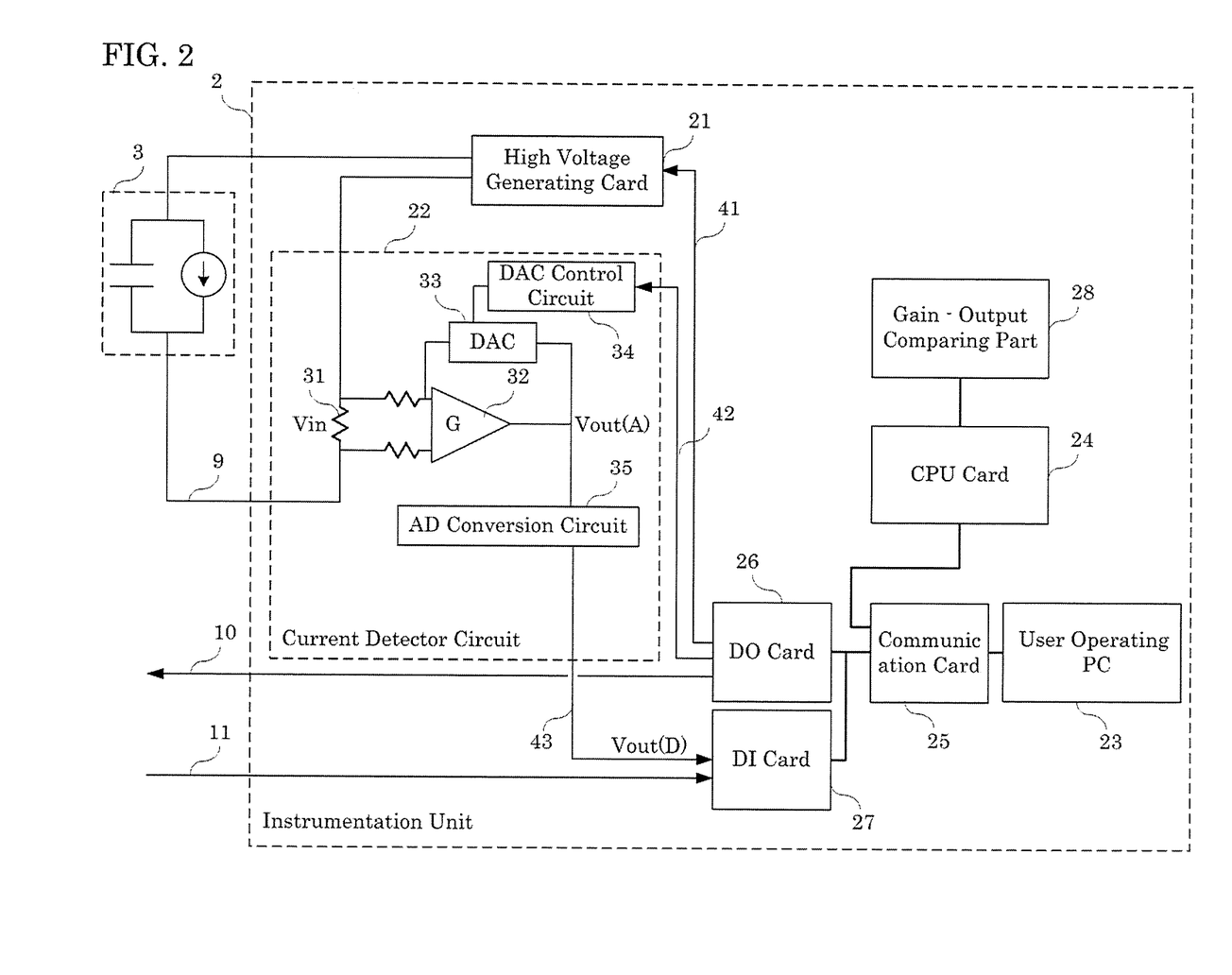
FIG. 2 is a block diagram for showing the internal configuration of an instrumentation unit according to Embodiment 1 of the present invention.

FIG. 2 shows the main configuration of a neutron flux measurement part. Based on the drawing, the function and operation of the incore nuclear instrumentation system 100 are explained. The instrumentation unit 2 consists of a high voltage generating card 21, a current detector circuit 22, a user operating PC (Personal Computer) 23, a CPU card (Central Processing Unit card) 24, a communication card 25, a digital output card (Digital Output card; DO card) 26, a digital input card (Digital Input card; DI card) 27, a gain-output comparing part 28, and others. An operator outputs instructions to the CPU card 24 through the user operating PC 23. The high voltage generating card 21 applies a direct current high voltage, which is set upped by the operator, to the neutron detector 3. The neutron detector 3 sends out a current signal (output signal), since an incident neutron ionizes the filler gas.

The current detector circuit 22 converts the current signal (neutron flux signal 9) from the neutron detector 3 into a voltage signal. The user operating PC 23 supervises the distribution of neutron fluxes in a reactor core based on a neutron flux signal 9 from the neutron detector 3. The user operating PC 23 issues an insertion operation command 10a to insert the neutron detector 3 into the inside of the reactor core, and a withdrawal operation command 10b to withdraw the neutron detector 3 to the outside of the reactor core. The insertion operation command and the withdrawal operation command of the neutron detector 3 are transmitted from the user operating PC 23 to the CPU card 24 via the communication card 25. The CPU card 24 performs an insertion operation command and a withdrawal operation command from the user operating PC 23, according to programmed and predetermined processing procedures, other than the processing of neutron flux signals from the neutron detector 3.

The digital output card (DO card) 26 transmits a high voltage set up signal 41 to the high voltage generating card 21, and transmits a gain control signal 42 to the current detector circuit 22. The digital input card (DI card) 27 receives a passage selection signal 11 and a neutron detector current value corresponding signal 43. The current detector circuit 22 is equipped with the function as a programmable gain amplifier, and then can change a gain continuously. The gain-output comparing part 28 remembers a matrix which shows the relation among the reactor power of the nuclear reactor 7, the gain of the current detector circuit 22, and the output voltage of the current detector circuit 22. The neutron detector current value corresponding signal 43 is a digital signal which is transmitted from the analog-digital conversion circuit 35 of the current detector circuit 22.

Figure 3:
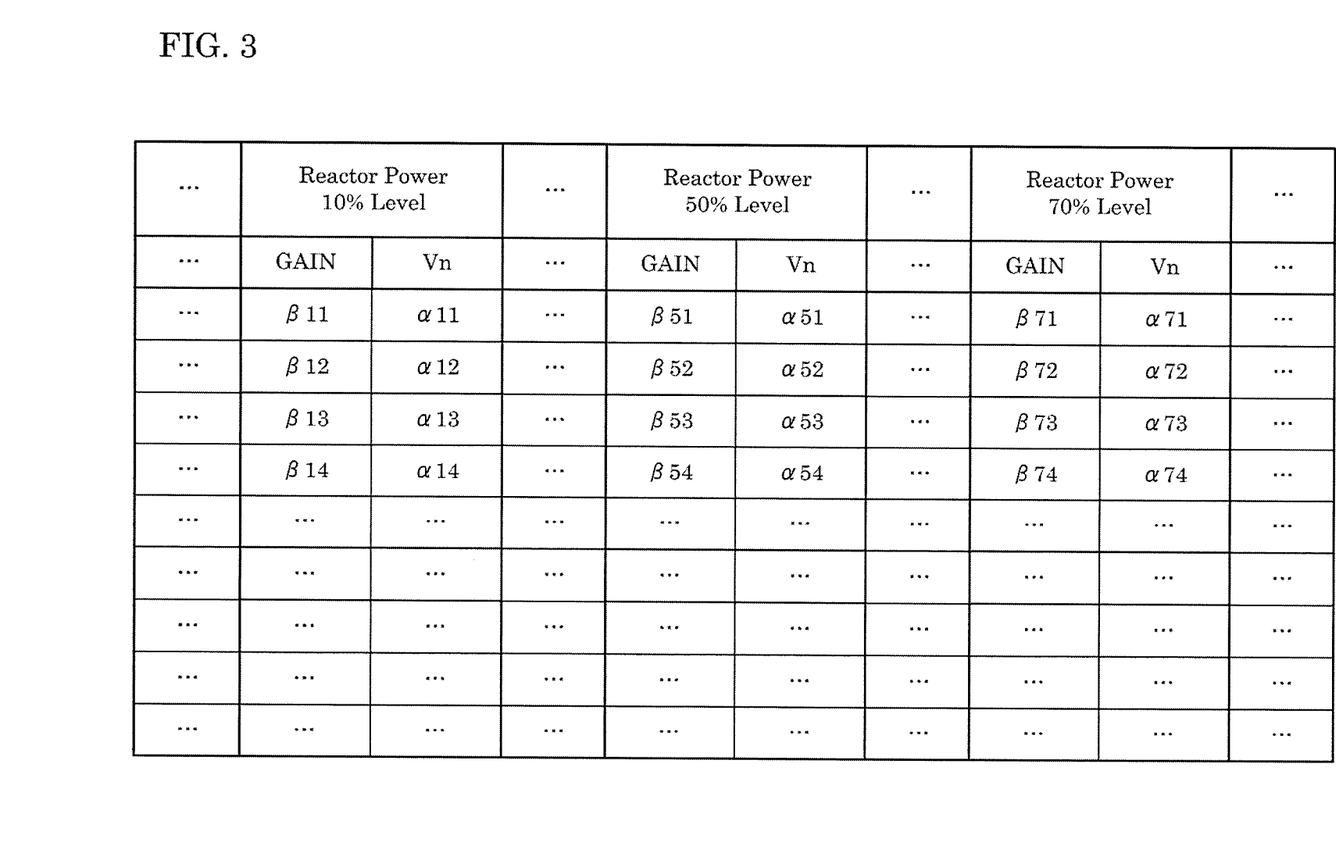
FIG. 3 is a table for showing a matrix which supports the relation between gains and reactor outputs in accordance with the embodiments of the present invention.

FIG. 3 shows an example of the matrix which supports the relation among the reactor power, the gain, and the output voltage, which have been memorized in the gain-output comparing part 28. The data are acquired beforehand at a specific measurement point which is common to all the detectors. The matrix shown in the drawing indicates a relation between the gain ($\beta$n) and the output voltage Vn, when the reactor is increased in its reactor power by an 1% increment. The output voltage Vn designates an output value ($\alpha$n) of the current detector circuit 22 (and the amplification circuit 32), which has been obtained when the nuclear reactor was operated at n % of the maximum output, before calibration is performed. The gain ($\beta$n) designates an amplification rate of the current detector circuit 22 (and the amplification circuit 32) on the condition that the output voltage Vn was obtained. Since a plurality of current detector circuits 22 (and amplification circuits 32) are provided in the system, there are a plurality of matrices, so that each of the matrices may correspond to each of the current detector circuits.

The gain-output comparing part 28 compares a reactor power and a matrix based on the neutron flux signal output (output voltage Vout) from the current detector circuit 22, determines a correction value of the gain, and performs a correction operation of the output voltage automatically. Here, the high voltage generating card 21, the current detector circuit 22, the user operating PC 23, the CPU card 24, the communication card 25, the digital output card 26, the digital input card 27, and the gain-output comparing part 28 are installed in the instrumentation unit 2. However, if the user operating PC 23 is disposed on the outside of the board of the instrumentation unit 2, for example, in a central control panel, an operator can monitor the distribution of neutron fluxes in a reactor core, and perform the insertion operation and the withdrawal operation of the neutron detector 3, at the central control panel Next, the configuration of the current detector circuit 22 will be explained. The current detector circuit 22 includes a current sensing resistor 31, an amplification circuit 32, a digital-analog converter (DAC; Digital-Analog Converter) 33, a digital-analog converter control circuit (DAC control circuit) 34, an analog-digital conversion circuit (AD conversion circuit) 35 and others. In the following explanation, a voltage signal which is obtained by converting a current signal (neutron flux signal 9) from the neutron detector 3 through the current sensing resistor 31 will be referred to as an input voltage Vin. An output voltage Vout (A) designates an output signal of the amplification circuit 32. An output voltage Vout (D) designates an output signal of the analog-digital conversion circuit 35.

The current sensing resistor 31 is installed at the input side of the amplification circuit 32, and converts a current signal neutron flux signal 9) from the neutron detector 3 into a voltage signal (input voltage Vin). The amplification circuit 32 amplifies the voltage signal (input voltage Vin), which is converted in the current sensing resistor 31, on the gain (G) which is indicated through a gain control signal 42. The digital-analog converter 33 functions as an equivalent resistance of the feedback circuit of the amplification circuit 32. The digital-analog converter control circuit 34 controls the digital-analog converter 33 based on the gain control signal 42 from the digital output card 26, and works as an equivalent resistance control circuit which changes the equivalent resistance of the feedback circuit of the amplification circuit 32.

The analog-digital conversion circuit 35 is a digital output circuit which outputs an output voltage signal of the amplification circuit 32. Here, an output signal of the analog-digital conversion circuit 35 is a digital voltage signal, which is obtained by converting a detection current (neutron flux signal 9) at the neutron detector 3 into a voltage signal (input voltage Vin) and then being amplified in the amplification circuit 32. Therefore, the output signal of this analog-digital conversion circuit 35 is referred to as a neutron detector current value corresponding signal 43, other than an output voltage Vout (D). The input voltage Vin of the amplification circuit 32 is a detector current equivalent value, which is detected at the current sensing resistor 31.

Next, the operations of the amplification circuit 32, the digital-analog converter 33, and the digital-analog converter control circuit 34 will be explained. The digital-analog converter 33 functions as an equivalent resistance of the feedback circuit of the amplification circuit 32. The digital-analog converter control circuit 34 functions as an equivalent resistance control circuit of the amplification circuit. 32. A gain control signal 42 is issued from the user operating PC 23 via the digital output card 26. The digital-analog converter control circuit 34 controls, according to the gain control signal 42, the magnitude of an equivalent resistance of the feedback circuit which is installed in the feedback circuit of the amplification circuit 32.

Since the digital-analog converter 33 corresponds to the equivalent resistance, the gain of the current detector circuit 22 (or the amplification circuit 32) can be changed variably. The input voltage Vin which is detected at the current sensing resistor 31 is amplified into an output voltage Vout (A) in the amplification circuit 32, at a gain G which corresponds to the gain control signal 42. The output voltage Vout (A) is AD converted into an output voltage Vout (D) at the analog-digital conversion circuit 35. The output voltage Vout (D) is also referred to as a neutron detector current value corresponding signal 43, and is read into the digital input card 27, and is processed at the CPU card 24. The input voltage Vin of the amplification circuit 32 is a detector current equivalent value, which is detected at the current sensing resistor 31.

Next, the operations of a high voltage generating card 21 will be explained. A preset value of the direct current high voltage is inputted from the user operating PC 23. The CPU card 24 outputs the preset value to the high voltage generating card 21 as a high voltage set up signal 41 via the digital output card 26. The CPU card 24 sets up a direct current high voltage which the high voltage generating card 21 generates. The high voltage generating card 21 generates a direct current high voltage which is set upped by the user operating PC 23, and applies the direct current high voltage to the neutron detector 3. In the drawing, one set of a high voltage generating card 21 and a current detector circuit 22 is shown. As mentioned above, a plurality of neutron detectors 3 are driven simultaneously and neutron flux signals are measured at a plurality of points of the nuclear reactor at the same time. Accordingly, the high voltage generating card 21 and the current detector circuit 22, that correspond to the plurality of neutron detectors 3 which are capable of same time driving, are installed in the instrumentation unit 2. For this reason, the current detector circuit 22 is referred to as a neutron flux current detector circuit.

Next, the role of a gain-output comparing part 28 will be explained. The gain-output comparing part 28 takes in the data of neutron detector current value corresponding signals 43, which have arrived at the CPU card 24 and are measured at a specific measurement point which is common to all of the detectors. The gain-output comparing part 28 acquires information which shows the relation between the gain and the output voltage. The gain-output comparing part 28 compares the information with the matrix of the gain and output voltage which is acquired in advance, and judges whether the neutron detector current value corresponding signal 43 is shifted from the data of the matrix which is acquired in advance, due to the reasons like the degradation of a neutron detector, or not. When it is judged that the shift is larger than a prescribed value, the gain-output comparing part 28 performs gain adjustment automatically consulting the matrix, and calibrates the amplification circuit 32 (or the current detector circuit, 22), so that a right neutron detector current value corresponding signal may be outputted. Therefore, the instrumentation unit 2 extracts from the matrix an output voltage Vn which corresponds to a present reactor power, and obtains a difference between the output voltage Vn corresponding to the present reactor power and the present output voltage Vout of the current detector circuit. The instrumentation unit 2 starts calibration of the current detector circuit, when the difference obtained is larger than a prescribed value.

Figure 4:
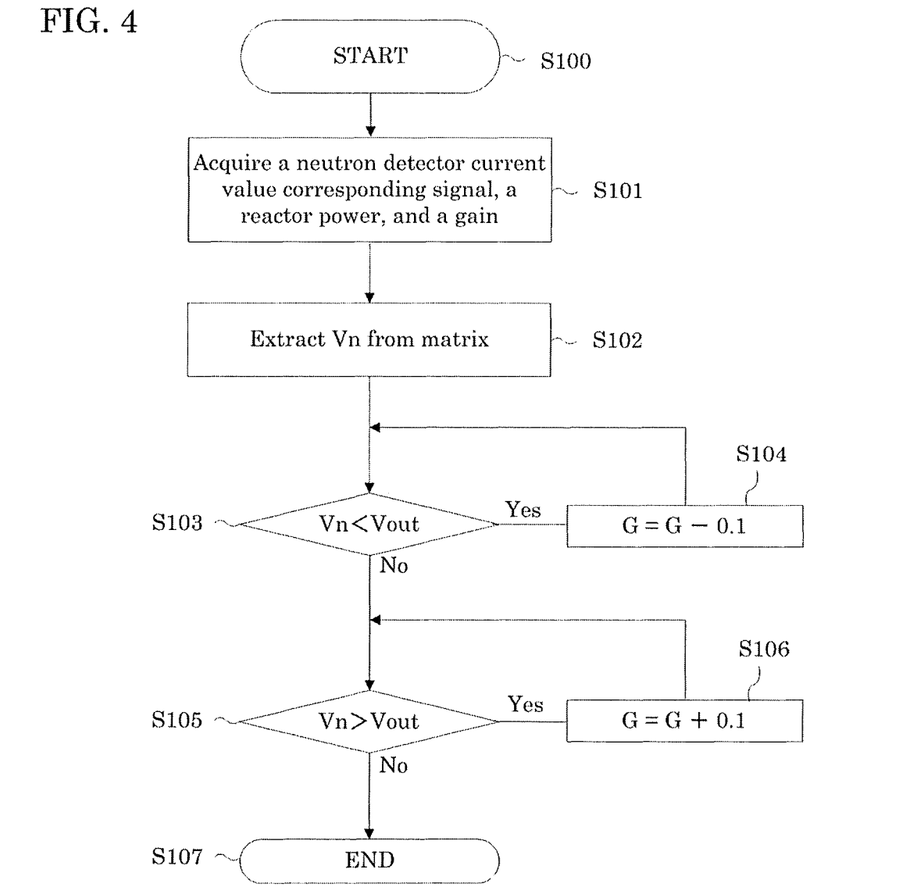
FIG. 4 is a processing flow chart for showing a first calibrating procedure of a current detector circuit according to the embodiments of the present invention.

FIG. 4 shows a first calibrating procedure which is performed in the gain-output comparing part 28 of the instrumentation unit 2, when the gain-output comparing part 28 carries out gain adjustment to the amplification circuit 32 (or the current detector circuit 22). This processing flow includes a process to consult the matrix of the gain and output voltage which is acquired in advance, and a process to adjust automatically the gain of the amplification circuit 32 (or the current detector circuit 22). When the processing flow starts, the gain-output comparing part 28 acquires the information on the neutron detector current value corresponding signal, the reactor power, and the gain at first (S100, S101). Furthermore, the gain-output comparing part 28 extracts from the matrix an output voltage Vn of the current detector circuit 22 which corresponds to a present reactor power and a present gain (S102).

In more precise words, a value (output voltage Vn) of the neutron detector current, value corresponding signal, which corresponds to the present gain (On), is extracted from the matrix, when the acquired present reactor power is at n %. Then, this value (output voltage Vn) is compared with an actually measured present value (output voltage Vout) of the neutron detector current value corresponding signal. In order to complete the purpose, judgement is made whether the acquired output voltage Vn is smaller than the present output voltage Vout of the current detector circuit or not. At the next step, when it is judged that the output voltage Vn is smaller than the output voltage Vout, a value which is smaller than the present gain (G) by a prescribed value is set as a new gain (G) of the current detector circuit. The current detector circuit operates at the new gain (G), and outputs a new output voltage Vout.

For example, when the present reactor power is at 100%, it is judged whether the output voltage V100 (=α100) which is extracted from the matrix is smaller than an actually measured value (output voltage Vout) of the neutron detector current value corresponding signal (S103). It is to be noted that, the neutron detector current value corresponding signal 43 and the output voltage Vout (A) are essentially equal. In the case that the output voltage V100<the output voltage Vout, as a result of the judgment, the gain (G) is reduced by a prescribed value (for example, 0.1), and the process returns to a step S103 (S104). As long as the answer of the judgment is Yes (in the case that the output voltage V100<the output voltage Vout), as a result of the judgment, S103 and S104 are repeated.

The process moves to a following step (S105), if the answer of the judgment becomes No (in the case that the output voltage V100≥the output voltage Vout). In the case that the output voltage V100>the output voltage Vout, as a result of the comparison, the gain (G) is increased by a prescribed value (for example, 0.1), and the process returns to step S105 (S106). As long as the answer of the judgement is Yes, as a result of the judgment (in the case that the output voltage V100>the output voltage Vout), S105 and S106 are repeated. The process will end (S107), if the answer of the judgment becomes No (in the case that the output voltage V100≤the output voltage Vout).

Figure 5:
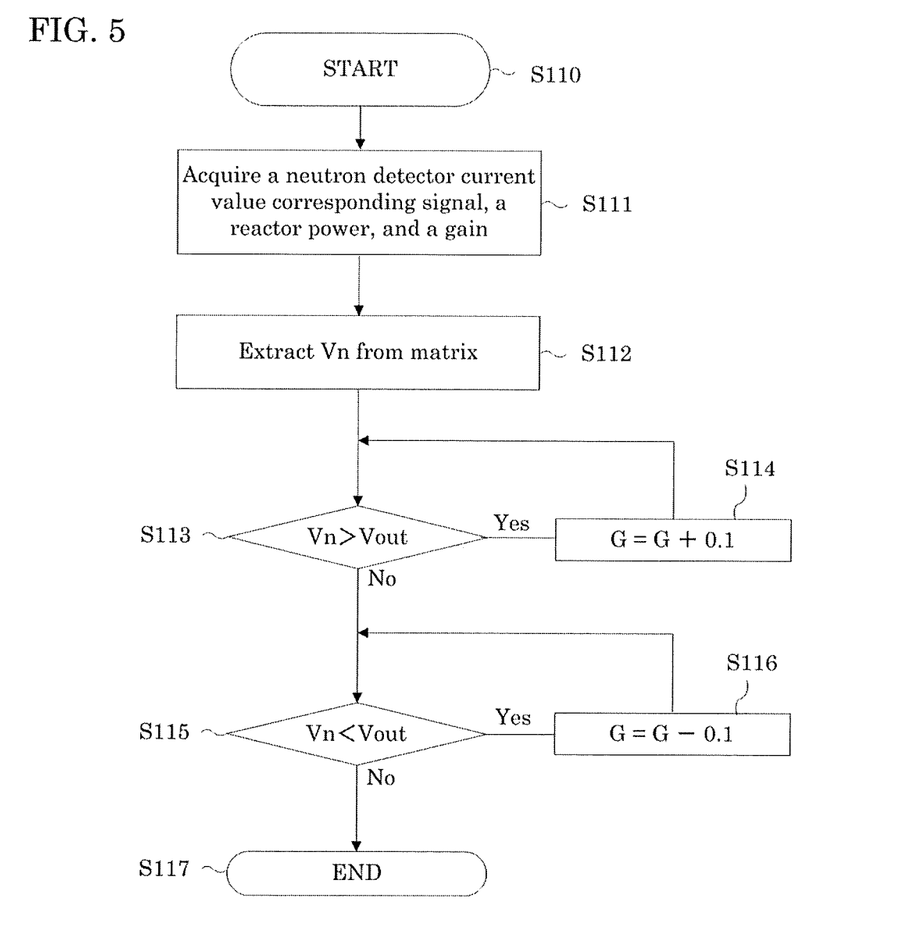
FIG. 5 is a processing flow chart for showing a second calibrating procedure of the current detector circuit according to the embodiments of the present invention.

FIG. 5 shows a second calibrating procedure which is performed in the gain-output comparing part 28 of the instrumentation unit 2, when the gain-output comparing part 28 carries out gain adjustment to the amplification circuit 32 (or the current detector circuit 22). This processing flow includes a process to consult the matrix of the gain and the output voltage which is acquired in advance, and a process to adjust automatically the gain of the amplification circuit 32 (or the current detector circuit 22). When the processing flow is started, the gain-output comparing part 28 will, first of all, acquire the information on the neutron detector current value corresponding signal, the reactor power, and the gain (S110, S111). Furthermore, the gain-output comparing part 28 extracts from the matrix an output voltage Vn of the current detector circuit 22 which corresponds to the present reactor power and the present gain (S112).

In more precise words, a value (output voltage Vn) of the neutron detector current value corresponding signal which corresponds to the present gain (βn) is extracted from the matrix, when the acquired present reactor power is at n %. Then, this value (output voltage Vn) is compared with the actually measured present value (output voltage Vout) of the neutron detector current value corresponding signal. In order to complete the purpose, it is judged whether the acquired output voltage Vn is larger than the present output voltage Vout of the current detector circuit or not. At the next step, a value which is larger than the present gain (G) by a prescribed value is set as a new gain (G) of the current detector circuit, when it is judged that the output voltage Vn is larger than the output voltage Vout. The current detector circuit operates at the new gain (G), and outputs a new output voltage Vout.

For example, it is judged whether the output voltage V100 (=α100) which is extracted from the matrix is larger than an actually measured value output voltage Vout) of the neutron detector current value corresponding signal or not (S113), when the present reactor power is at 100%. It is to be noted that, the neutron detector current value corresponding signal 43 and the output voltage Vout (A) are essentially equal. In the case that the output voltage V100>the output voltage Vout, as a result of the judgment, the gain (G) is reduced by a prescribed value (for example, 0.1). The current detector circuit, is operated, and the process returns to step S113 (S114). As long as the answer of the judgement is Yes (in the case that the output voltage V100>the output voltage Vout), as a result of the judgment, S113 and S114 are repeated.

The process will move to a following step (S115), if the result of the judgement becomes No (in the case that the output voltage V100≤the output voltage Vout). In the case that the output voltage V100<the output voltage Vout, as a result of comparison, the gain (G) is reduced by a prescribed value (for example, 0.1). The current detector circuit is operated, and the process returns to step S115 (S116). As long as the answer of the judgment is Yes (in the case that the output voltage V100<the output voltage Vout), as a result of the judgment, S115 and S116 are repeated. The process will end (S117), if the result of the judgment becomes No (in the case that the output voltage V100≥the output voltage Vout).

The incore nuclear instrumentation system in accordance with the present embodiment carries out the above mentioned procedures to all of the neutron detectors. When the calibrating processing flow of the neutron detector is completed, the correction of differences in each detector can be completed and variations in the measured values due to the individual difference in the detector sensitivity can be reduced. It is to be noted that, since the variations in measured values are reduced, the accuracy in measured values is improved. Since the incore nuclear instrumentation system in accordance with the present embodiment carries out these procedures by himself, correction works with another dedicated device are eliminated, and then, labor saving and shortening of working hours can be attained.

A first object of the present invention is to eliminate the necessity of a dedicated device for correcting the individual difference of the neutron detectors, and to aim at the labor saving in correction works and the shortening of working hours. In order to achieve the purpose, the incore nuclear instrumentation system in accordance with the present embodiment comprises a neutron flux current detector circuit which changes a neutron flux signal current from a neutron detector into a voltage signal, and can vary the gain of amplification continuously, and a gain-output comparing part which compares the matrix of the gain and the output voltage which has been acquired in advance and the measurement data, and is characterized in that the core output distribution of a nuclear reactor is measured based on the output voltage signal of the neutron flux current detector circuit.

In addition, the incore nuclear instrumentation system in accordance with the present embodiment is characterized in that the neutron flux current detector circuit includes a current sensing resistor which changes the neutron flux signal current from a neutron detector into a voltage signal, an amplification circuit which can control the value of the equivalent resistance of a feedback circuit which amplifies the voltage signal changed at the current sensing resistor, an equivalent resistance control circuit which changes the resistance of the equivalent resistance of the feedback circuit, and an output circuit which outputs an output voltage signal of the current detector circuit. Moreover, a second object of the present invention is to offer an incore nuclear instrumentation system which can reduce measurement errors by the degradation of the measurement system hardware, and enables the maintenance of the system soundness.

In order to achieve the purpose, the gain-output comparing part in accordance with the present embodiment reads in the data of the neutron detector current value corresponding signal 43 which arrive at the CPU card 24 and are measured in a specific measurement point which is common to all of the detectors, and acquires the information on the gain and the reactor power voltage. The information is compared with the matrix of the gain and output voltage which is acquired in advance. When a value of the neutron detector current value corresponding signal 43 has shifted from the data of the matrix acquired in advance, due to the reasons like the degradation of a detector and others, gain adjustment is performed automatically, in conformity with the processing flow of the detector calibrating, and correction is performed to obtain right neutron detector current value corresponding signals.

Embodiment 2

Figure 6:
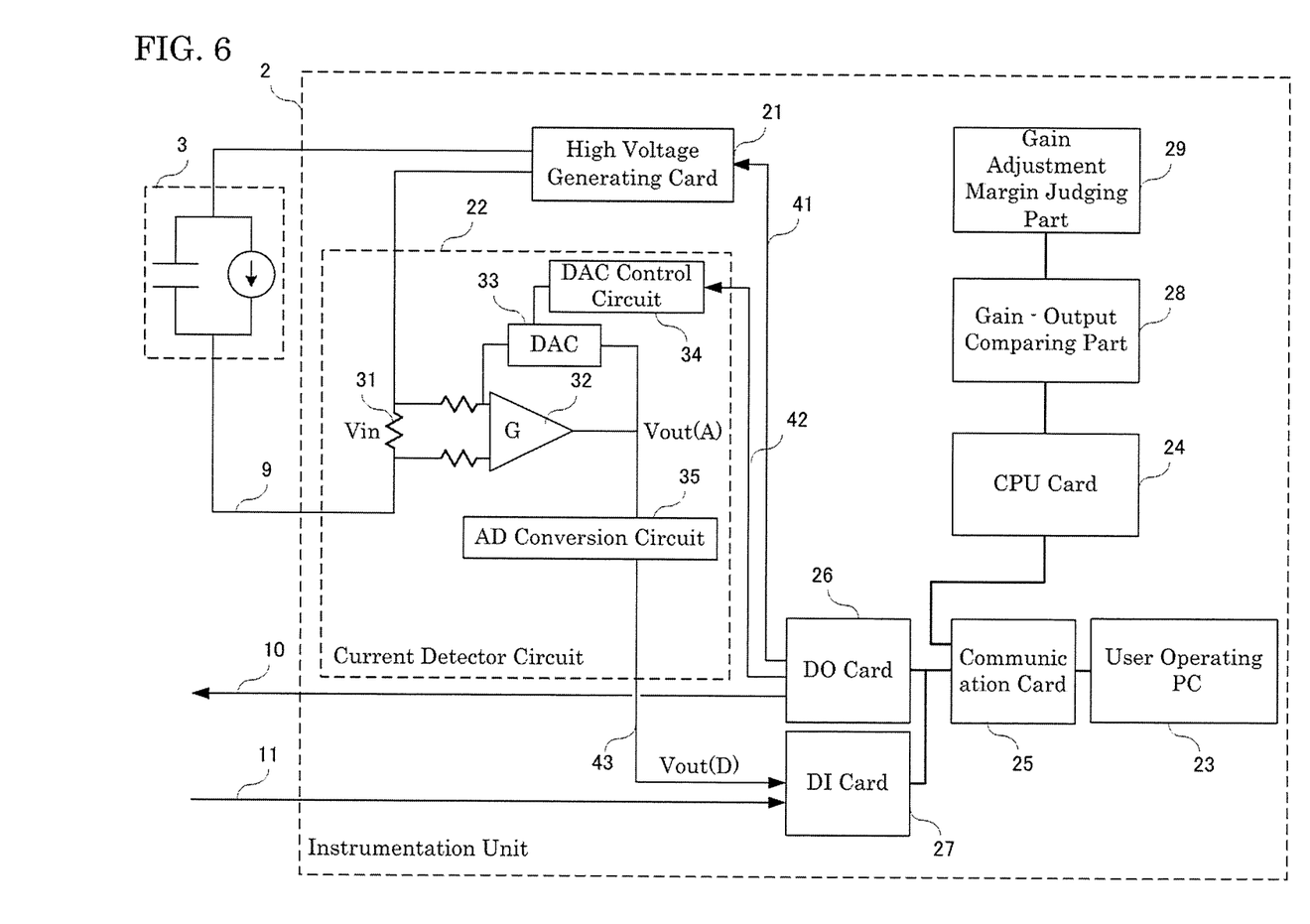
FIG. 6 is a block diagram for showing the internal configuration of an instrumentation unit according to Embodiment 2 of the present invention.

An incore nuclear instrumentation system in accordance with Embodiment 2 is explained based on FIG. 6. As shown in the drawing, the incore nuclear instrumentation system 100 according to the present embodiment includes a gain adjustment margin judging part 29 which is disposed in the instrumentation unit 2. The gain adjustment margin judging part 29 has functions to memorize a threshold value of the gain adjustment margin, to receive a data from the gain-output comparing part 28, and to check an adjustment value of the gain (G) in the processing flow of the detector calibrating. The gain adjustment margin judging part 29 judges that the neutron detector or the measurement system hardware has deteriorated, when gain adjustment in the processing flow needs an adjustment, larger than the threshold value of the gain adjustment margin.

Therefore, the instrumentation unit in accordance with the present embodiment calculates a difference between a gain after the calibration and a gain before the calibration. The incore nuclear instrumentation system in accordance with the present embodiment is characterized in that the instrumentation unit judges that degradation has arisen to the system, when the calculated difference is larger than a threshold value. Since the incore nuclear instrumentation system in accordance with the present embodiment can achieve a judgment on whether the neutron detector or the measurement system hardware has deteriorated or not, from the threshold value of the gain adjustment margin, it is possible to judge the time for replacement of the neutron detector or the measurement system hardware. In other words, the incore nuclear instrumentation system in accordance with the present embodiment is characterized in that the system has a gain adjustment margin judging part which has a function to check a gain adjustment margin, in addition to the configurations of Embodiment 1.

Embodiment 3

Figure 7:
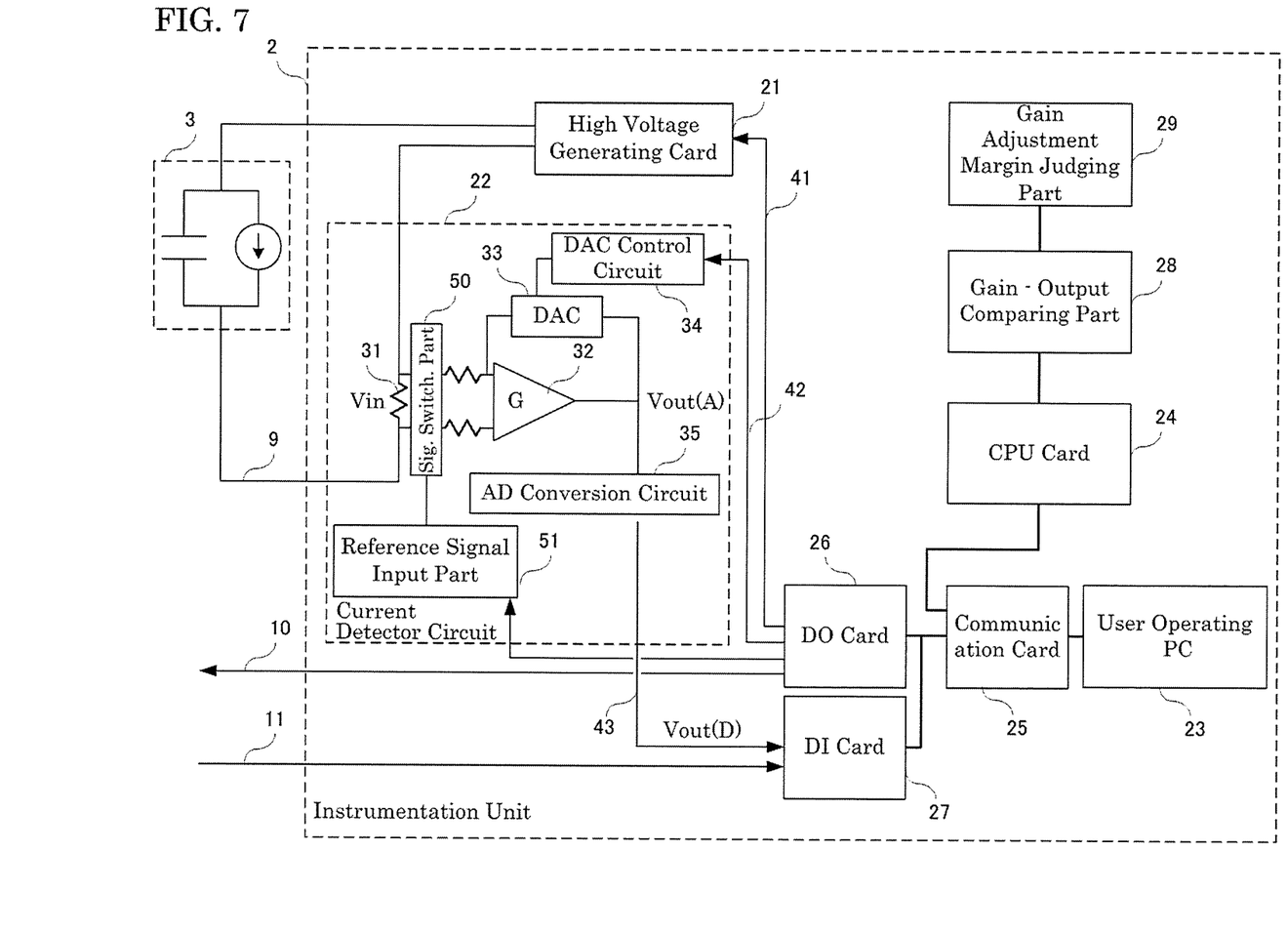
FIG. 7 is a block diagram for showing the internal configuration of an instrumentation unit according to Embodiment 3 of the present invention.

An incore nuclear instrumentation system in accordance with Embodiment 3 is explained based on FIG. 7. As shown in the drawing, the incore nuclear instrumentation system 100 in accordance with the present embodiment includes a signal switching part 50 and a reference signal input part 51 which are disposed in the current detector circuit 22. The signal switching part 50 is installed in the input side of the amplification circuit 32, and performs a switching operation of input signals to the amplification circuit 32, according to the instruction from the reference signal input part 51. When the input mode of the current detector circuit 22 is measurement mode, an output signal (neutron flux signal 9) from the neutron detector 3 is inputted into the amplification circuit 32. When the input mode of the current detector circuit 22 is switched from the measurement mode to the judgment mode, according to the direction from the user operating PC 23, the signal switching part 50 will switch the input signal receiver of the amplification circuit 32 from the neutron detector 3 to the reference signal input part 51. As a result, when the input mode of the current detector circuit 22 is judgment mode, an imitation signal of the output current of the neutron detector 3, which is assumed from the present reactor power, is inputted from the reference signal input part 51 to the current detector circuit 22.

Even in the incore nuclear instrumentation system in accordance with Embodiments 1 and 2, it is impossible to judge whether the true cause is in the neutron detector, or whether the true cause is in the measurement system hardware, when a change is found in the measured output data. When a method in accordance with Embodiment 3 is employed to perform the judgment mode, it is possible to obtain information on what kind of action the measurement system hardware should carry out, when a signal from the neutron detector is right. When a gain adjustment which is larger than a threshold value is required in Embodiment 2, it is possible to judge whether the detector has deteriorated or whether the measurement system hardware is out of order, by employing the method according to Embodiment 3.

The instrumentation unit in accordance with the present embodiment is characterized in that an imitation signal is input into the current detector circuit, and a judgement is performed on the degradation part of the system based on the output voltage Vout of the current detector circuit which corresponds to the imitation signal. Therefore, the incore nuclear instrumentation system can respond automatically to the degradation of the neutron detector, the degradation of the measurement system hardware, and others. Labor saving in the maintenance of the entire system can be attained. In other words, the incore nuclear instrumentation system in accordance with the present embodiment is characterized in that the instrumentation unit includes a reference signal input part which performs inputting of a specified output current, and a signal switching part which performs switching between a signal of a neutron detector and a signal from a reference signal input part, in addition to the configurations of Embodiment 2.

It is to be noted that each embodiment of the present invention may be freely combined, or appropriately modified or omitted within the spirit and scope of the invention.

EXPLANATION OF NUMERALS AND SYMBOLS

2 Instrumentation Unit, 3 Neutron Detector, 4 Drive Unit, 5 Passage Selection Unit, 6 Thimble, 7 Nuclear Reactor, 7a Reactor Core, 8 Containment Vessel, 9 Neutron Flux Signal, 10a Insertion Operation Command, 10b Withdrawal Operation Command, 11 Passage Selection Signal, 21 High Voltage Generating Card, 22 Current Detector Circuit, 23 User Operating PC, 24 CPU Card, 25 Communication Card, 26 Digital Output Card, 27 Digital Input Card, 28 Gain-Output Comparing Part, 29 Gain Adjustment Margin Judging Part, 31 Current Sensing Resistor, 32 Amplification Circuit, 33 Digital-Analog Converter, 34 DAC Control Circuit, 35 Analog-Digital Conversion Circuit, 41 High Voltage Set Up Signal, 42 Gain Control Signal, 43 Neutron Detector Current Value Corresponding Signal, 50 Signal Switching Part, 51 Reference Signal Input Part, 100 Incore Nuclear Instrumentation System.

What is claimed is:

1. An incore nuclear instrumentation system, comprising a neutron detector for installation in a nuclear reactor stored in a containment vessel, and
an instrumentation unit which has a current detector circuit for installation on the outside of the containment vessel,
wherein an output signal of the neutron detector is configured to be input into the current detector circuit, and
the instrumentation unit is configured to remember a matrix comprising a table that records a respective output voltage value Vn for each of a plurality of combinations of a reactor power of the nuclear reactor and a gain of the current detector circuit, and calibrates the current detector circuit based on the output voltage value Vn recorded in the matrix that corresponds to a present reactor power and gain.

2. The incore nuclear instrumentation system according to claim 1, wherein the instrumentation unit is configured to perform, at a time when the calibration of the current detector circuit is performed,
a first step for extracting an output voltage Vn corresponding to a present reactor power and a present gain from the matrix,
a second step for judging whether the output voltage Vn extracted at the first step is smaller than a present output voltage Vout of the current detector circuit or not, and
a third step for setting a value which is smaller than the present gain by a prescribed value as a gain of the current detector circuit, when it is judged at the second step that the output voltage Vn is smaller than the output voltage Vout.

3. The incore nuclear instrumentation system according to claim 2,
wherein the instrumentation unit is configured to perform, after the second step is performed,
a fourth step for judging whether the output voltage Vn extracted at the first step is larger than the present output voltage Vout of the current detector circuit or not, and
a fifth step for setting a value which is larger than the present gain by a prescribed value as a gain of the current detector circuit, when it is judged at the fourth step that the output voltage Vn is larger than the output voltage Vout.

4. The incore nuclear instrumentation system according to claim 1,
wherein the instrumentation unit performs, at a time when the calibration of the current detector circuit is performed,
a first step for extracting an output voltage Vn corresponding to a present reactor power and a present gain from the matrix,
a second step for judging whether the output voltage Vn extracted at the first step is larger than a present output voltage Vout of the current detector circuit or not, and
a third step for setting a value which is larger than the present gain by a prescribed value as a gain of the current detector circuit, when it is judged at the second step that the output voltage Vn is larger than the output voltage Vout.

5. The incore nuclear instrumentation system according to claim 4,
wherein the instrumentation unit performs, after the second step is performed,
a fourth step for judging whether the output voltage Vn extracted at the first step is smaller than the present output voltage Vout of the current detector circuit or not, and
a fifth step for setting a value which is smaller than the present gain by a prescribed value as a gain of the current detector circuit, when it is judged at the fourth step that the output voltage Vn is smaller than the output voltage Vout.

6. The incore nuclear instrumentation system according to claim 2,
wherein the instrumentation unit is configured to calculate a difference between a gain after the calibration and a gain before the calibration, and
configured to judge that degradation has arisen to the system, when the difference calculated is larger than a threshold value.

7. The incore nuclear instrumentation system according to claim 6,
wherein the instrumentation unit is configured to input an imitation signal into the current detector circuit, and
configured to judge the degradation part of the system based on the output voltage Vout of the current detector circuit corresponding to the imitation signal.

8. The incore nuclear instrumentation system according to claim 1,
wherein the instrumentation unit is configured to calculate a difference between the output voltage value Vn stored in the matrix corresponding to the present reactor power and a present output voltage Vout of the current detector circuit, and
configured to start a calibration of the current detector circuit, when the difference calculated is larger than a prescribed value.

9. The incore nuclear instrumentation system according to claim 4,
wherein the instrumentation unit calculates a difference between a gain after the calibration and a gain before the calibration, and
judges that degradation has arisen to the system, when the difference calculated is larger than a threshold value.

10. The incore nuclear instrumentation system according to claim 9,
wherein the instrumentation unit inputs an imitation signal into the current detector circuit, and
judges the degradation part of the system based on the output voltage Vout of the current detector circuit corresponding to the imitation signal.

* * * * *